(12) United States Patent
Ziger et al.

(10) Patent No.: US 6,301,008 B1
(45) Date of Patent: Oct. 9, 2001

(54) ARRANGEMENT AND METHOD FOR CALIBRATING OPTICAL LINE SHORTENING MEASUREMENTS

(75) Inventors: David Ziger; Pierre Leroux, both of San Antonio, TX (US)

(73) Assignee: Philips Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 09/264,742

(22) Filed: Mar. 8, 1999

Related U.S. Application Data

(63) Continuation-in-part of application No. 08/951,396, filed on Oct. 16, 1997, now Pat. No. 5,962,173, which is a continuation-in-part of application No. 08/826,482, filed on Mar. 27, 1997, now Pat. No. 5,902,703.

(51) Int. Cl.$^7$ ............................. G01B 11/00; G01N 21/86
(52) U.S. Cl. ...................... 356/401; 356/400; 250/559.3
(58) Field of Search .................................. 356/400, 401, 356/375; 250/559.3

(56) References Cited

U.S. PATENT DOCUMENTS 5,629,772 * 5/1997 Ausschnitt ........................... 356/372

OTHER PUBLICATIONS

T.E. Adams, "Applications of latent image metrology in microlithography," *Proc SPIE* 1464, 294–303 (1991).
T.A. Brunner, "New focus metrology technique using special test mask," *OCG Interface* (1993), pp 1–9.
T.A. Brunner, T.L. Martin, R.M. Martino, C.P. Ausschnitt and T.H. Newman, "Quantitative stepper metrology using focus monitor test mask," *Proc SPIE* 2197, 541–549 (1994).
D.H. Ziger, T.E. Adams, and J. Garofallo, "Linesize effects on ultraviolet reflectance spectra," *Opt. Eng.*, 36, pp 243–250 (1997).
C.P. Ausschnitt and M.E. Lagus, "Seeing the forest for the trees: a new approach to CD control," Proceedings of the SPIE, 3332, pp. 212–220 (1998).
O.W. Otto and R.C. Henderson, "Integrating proximity effects corrections with photomask data preparation," *Proc SPIE* 2440, 184–191 (1995).
E. Barouch, U. Hollerbach and R. Vallishayee, "OPTI-MASK: An OPC Algorithm for Chrome and Phase–Shift Mask Design," *Proc SPIE* 2440, 1992–206 (1995).
M. Sugawara, H. Kawahira, K. Tsudaka and S. Nozawa, "Practical evaluation of optical proximity effect correction by EDM methodology," *Proc SPIE* 2440, 207–219 (1995).
R. Pforr, et al., "Feature biasing versus feature–assisted lithography–a comparison of proximity corrections," *Proc SPIE* 2440, 150–170 (1995).

\* cited by examiner

Primary Examiner—F L Evans
Assistant Examiner—Zandra V. Smith
(74) Attorney, Agent, or Firm—Crawford PLLC

(57) ABSTRACT

A semiconductor fabrication process permits for narrowing linewidths using Optical End of Line Metrology (OELM). OELM involves measuring relative line shortening effects that are inherent in many semiconductor fabrication processes using optical overlay instruments. According to one embodiment, the process involves a frame that has two adjacent sides which are constructed of lines and spaces. The frame is imaged onto a wafer, but the optical line measurements used to implement the frame over-predict actual shortening of the lines. To calibrate the optical line measurements to the physical implementation, corrections are determined to relate the optical measurements to the actual line shortening: a relationship between the narrow linewidth elements of varying line lengths using a representation and the narrow linewidth elements in a physical implementation of the representation, a pitch effect for the narrow linewidth elements when using the alignment tool, and a duty cycle effect reflecting the impact of the line-size/spacing of the lines in the grating. A processor then calibrates the optical aligning tool as a function of these factors.

23 Claims, 8 Drawing Sheets

"b1"   "b2"

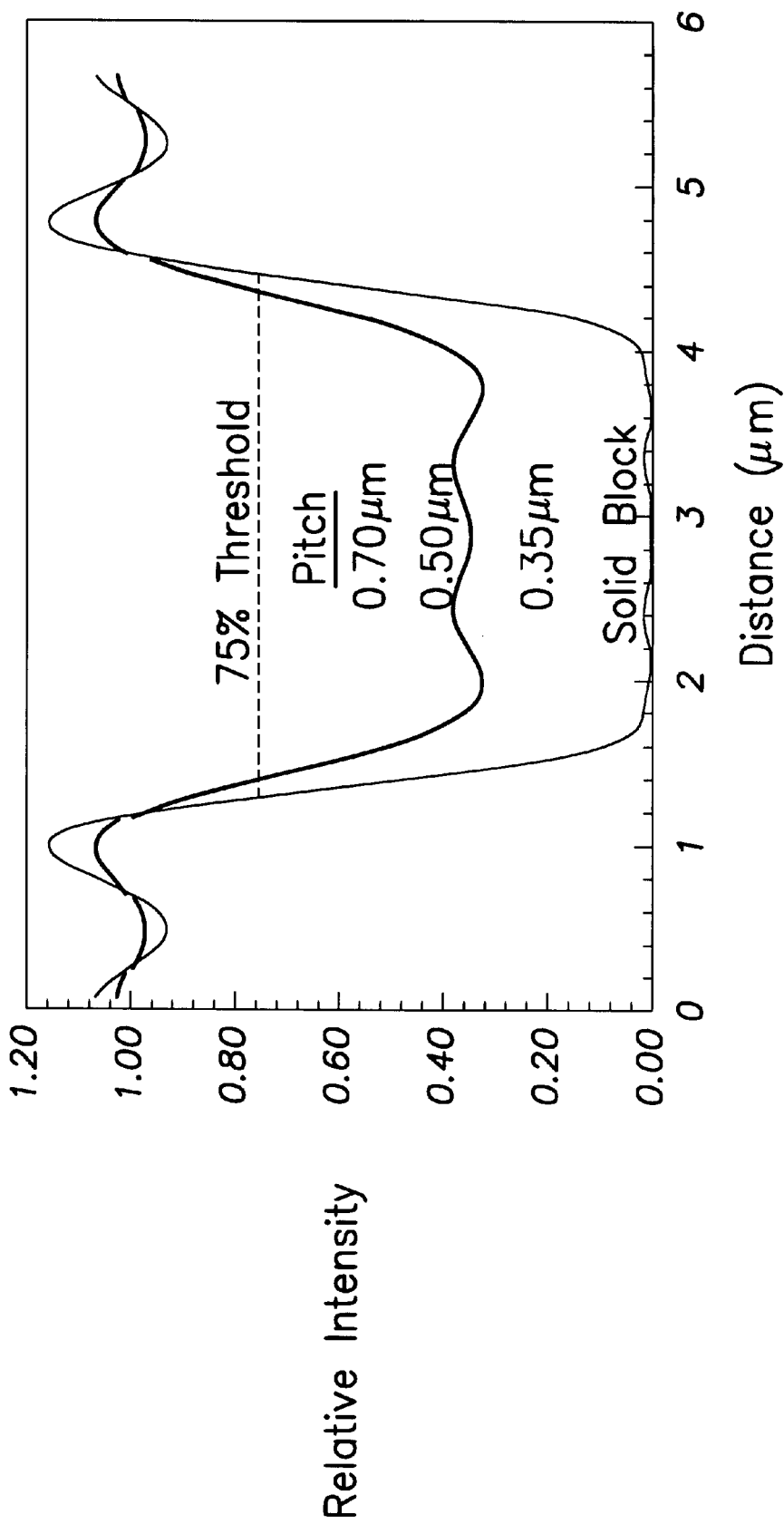
FIG.5 Aerial images for 0.2μm lines at various pitches. The gratings are 3.00μm long

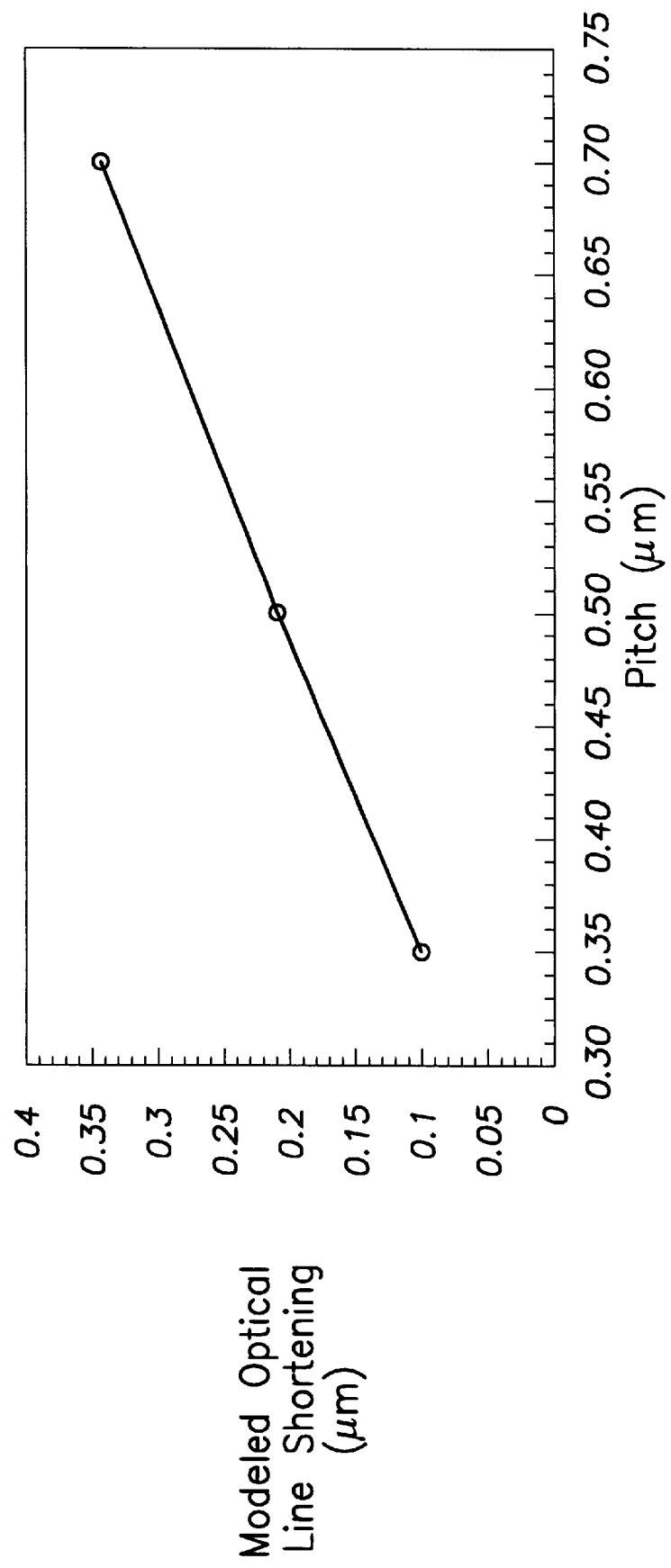
FIG.6 Modeled optical line shortening as a function of pitch for 0.2μm lines in 3.00μm gratings of various pitches.

Line shortening measured using optical ELM for various pitches as a function of duty cycle Line shortening measured using SEM for various pitches as a function of duty cycle

ARRANGEMENT AND METHOD FOR CALIBRATING OPTICAL LINE SHORTENING MEASUREMENTS

RELATED APPLICATIONS

This application is a continuation-in-part of an application entitled "Method for Measuring the Effectiveness of Optical Proximity Corrections," U.S. patent application Ser. No. 08/951,396, now U.S. Pat. No. 5,962,173, filed Oct. 16, 1997, which is a continuation-in-part of an application entitled "Method for Measuring Dimensional Anomalies in Photolithographed Integrated Circuits Using Overlay Metrology and Masks Therefor", Ser. No. 08/826,482, now U.S. Pat. No. 5,902,703, filed Mar. 27, 1997, naming the same inventors and assigned to the same assignee as hereof.

FIELD OF THE INVENTION

This invention relates to semiconductor devices and their manufacture and, more particularly, to arrangements and processes for developing relatively narrow linewidths of elements such as gate lines, while maintaining accuracy in their fabrication.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

An important part of semiconductor processing is the capability of the optical lithographic process. Optical lithography is used to create semiconductor elements, including those having such narrow linewidths. Optical lithography involves the creation of images of one or more circuit elements or features and projecting those elements or features onto a semiconductor wafer.

Due to the smaller geometries used in today's semiconductors, there has been less tolerance for dimensional anomalies and related geometry inaccuracies. Like other fabrication equipment used in the manufacture of today's semiconductors, optical lithography equipment contributes to such anomalies and inaccuracies. Consequently, optical lithography equipment is regularly checked and measured to ensure that the images being obtained and used from the optical lithography equipment are as true as possible.

One common method for making such checks and measuring discrepancies involves the definition of a traditional box-in-box structure. Such a structure has an outside box of about 20 µm square defined by a line or trench and a centrally disposed inside box of about 10 µm square similarly defined by a line or trench. In either case, the box-in-box configuration utilizes measurements between edges of the boxes. It will be understood that the capability of the overlay metrology tool to recognize the edges of boxes is sometimes limited by the discernibly of the box edges, by contrasts and differences in color shading at the box edges, and by the ability of the overlay metrology tool to distinguish junctions defining a solid square rather than merely a line configuration, such as a pattern of laterally spaced lines.

In some instances, such as defined in the above identified parent application, it is useful to take calibrating measurements of lines that, when printed, are narrow enough to be shortened to the same degree that the feature lines of the finished circuit will be shortened. The degree of line shortening can then be determined and the dimensions of the mask feature can be accurately lengthened to compensate for the expected line shortening when the mask is used to create the line feature on the resist. In addition to lengthening the mask line, other forms of line shortening corrections may be used. Examples include the use of enlargements at the ends of the lines in the form of hammerheads or various other forms of serifs. Very small island features (also known as pillar features) have the same shortening effect as narrow lines, but in two dimensions rather than one. Many of the same forms of correction used to correct line shortening can also be used to correct the shortening of both dimensions of islands.

In many instances, the individual features of a circuit, such as the gate lines, have extremely small dimensions and may have widths of less than 0.2 µm to 0.4 µm with their lengths being considerably greater, perhaps 0.8 µm to 2.0 µm. Moreover, the thin gate lines may well be intended for connection to other layers of the integrated circuit by way of narrow vias filled with electrically conductive material. When dimensions reach such small size, there is not only a tendency for the formed line to be shorter than its design length as defined by the mask, but also the positioning of the vias may not be aligned to the target structure(s). Transfer differences of such critical dimension occurs when a desired circuit feature is particularly thin or small because of optical diffraction effects. As feature sizes get smaller, diffraction defects increase.

To maintain the accuracy of narrow linewidths during the optical lithograph process, optical proximity correction (OPC) systems are typically used. One form of OPC is to utilize masks which include images that are distorted to an outline that is different from the outline of the desired feature. This difference is used to reverse the anticipated distortion that would otherwise result from the printing system. One example of OPC is to provide a mask having the outline of a narrow line feature lengthened as compared to the length of the line "as drawn" (the intended length of the feature on the resist). Such OPC systems are extremely beneficial. However, in the fabrication of integrated circuits (ICs) having relatively narrow linewidths on different levels of the circuit, with the linewidth elements interconnected by conductive material deposited in vias extending between levels, the accuracy of forming and positioning the lines and the vias becomes increasingly critical. Relatively minor errors in positioning such features can cause a via to miss the line altogether or to contact the line over a surface area that is insufficient to provide the necessary conductivity for a fully-functional circuit.

FIGS. 1A, 1B and 1C illustrate an aspect of the problem discussed above for a modified box-in-box structure. These figures show a mask (FIG. 1A) for the box-in-box structure, a scanning electron microscope (SEM) photograph (FIG. 1B) of a photoresist formed using the mask of FIG. 1a, and an optically-acquired image (FIG. 1C) of a structure implemented onto a wafer using the photoresist of FIG. 1B. When projecting the lines of the structure of FIG. 1A onto a positive resist, as shown in FIG. 1B, the length of the imaged line is somewhat smaller than the corresponding mask feature. The left and bottom portions of the structure of FIG. 1A are large blocks of metal while the top and right are constructed from sub half-micron lines and spaces. While the large blocks will transfer their geometries with minimal distortion, the lines and space patterns will be somewhat truncated depending on their line width. If the resulting pattern (FIG. 1C) is viewed optically, the sections constructed of gratings will not be resolved into discrete lines and spaces but will appear as a solid blocks. FIG. 1C shows these line endings of the grating sections as a single edge. Truncation should have the effect of apparently shifting the center box towards the grating sections with misalignment being a relative measure of the truncation.

Accordingly, the ability to manufacture within relatively narrow lines using optical lithography is an important aspect of semiconductor processing. Such processing continues to be burdened by inaccuracies from the stage involving optical measurements of the extremely narrow linewidths to the practical implementation stage where the characterized linewidths are used to build narrow linewidth elements in a sub-micron process. For such semiconductor manufacturing processes and arrangements, it would be helpful to determine the effect of and to account for line shortening using optical measurements.

SUMMARY

According to various aspects of the present invention, embodiments thereof are exemplified in the form of methods and arrangements for fabricating semiconductor structure using Optical End of Line Metrology (OELM) and an optical alignment measurement tool calibrated as a function of a pitch effect and a determined relationship. Relative line shortening effects are inherent in many semiconductor fabrication processes that use optical line measurements to image a frame onto a wafer. For example, when imaging a frame onto a wafer where the frame has two adjacent sides constructed of lines and spaces, optical tools tend to overpredict actual shortening of the lines. To calibrate the optical line measurements to the physical implementation, corrections are determined to relate the optical measurements to the actual line shortening. This involves determining a relationship between the narrow linewidth elements of varying line lengths using a representation and the narrow linewidth elements in a physical implementation of the representation, and determining a pitch effect for the narrow linewidth elements when using the alignment tool. A processor then calibrates the optical aligning tool as a function of the relationship and the pitch effect.

In a more specific implementation of the above fabrication process, the pitch effect is determined using a process that obtains measurements of a plurality of pitches for lines having the same length. Further, determining the above relationship includes determining an offset in linearity by obtaining measurements of a plurality of line lengths for a set of lines having the same pitch.

In another specific embodiment of the above fabrication process and also according to the present invention, determining the relationship involves determining an offset in linearity as a function of one or more of the following: a relationship between optical line shortening and line length mask bias; a degree of linearity in a relationship between optical line shortening and line length mask bias; and a relationship between line size and at least one of an optical line shortening factor and line length mask bias factor. In this context, line length mask bias refers to the difference in measurements on the mask between the width of the solid (e.g., dimension b1 of FIG. 1B) and the opposing grating along the line length (e.g., dimension b2 of FIG. 1B).

According to other aspects of the invention, each of the above example embodiments can be implemented by taking into account the effect of the duty cycle, in addition to the relationships pertaining to pitch and grating length. By keeping the pitch and the grating length constant, the duty cycle (referring to the spacing between the lines versus the width of the lines) can be determined and considered in a linear regression analysis along with the relationships pertaining to pitch and grating length. While considering only pitch and grating length factors in a linear regression analysis can provide adequate calibration data for some applications, considering all three factors in the analysis provides for a more accurate calibration.

The above summary is not intended to provide an overview of all aspects of the present invention. Other aspects of the present invention are exemplified and described in connection with the detailed description.

BRIEF DESCRIPTION OF THE DRAWINGS

Various aspects of, discoveries made in connection with, and advantages of, the present invention will become apparent upon reading the following detailed description of various example embodiments and upon reference to the drawings in which:

FIG. 5 is a graph showing data corresponding to aerial images for 0.2 micron line lengths at various pitches, according to the present invention;

FIG. 6 is a graph showing a relationship between line shortening as a function of pitch for 0.2 micron lines in 3.00 micron gratings of various pitches, according to the present invention.

Figure 1A:
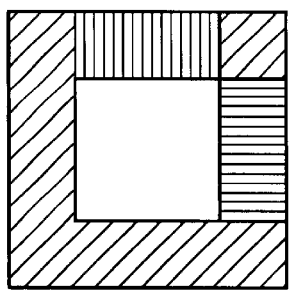
FIGS. 1A, 1B and 1C illustrate a modified box-in-box structure as captured in the forms of a mask (FIG. 1A), a scanning electron microscope (SEM) photograph (1B) of a photoresist formed using the mask, and an optically-acquired image (1C) of a structure implemented onto a wafer using the photoresist.
Figure 1B:
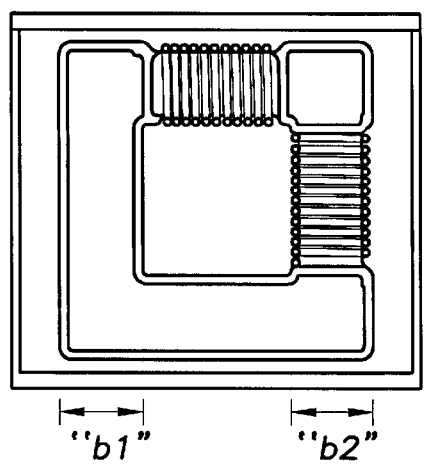

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of semiconductor structures and has been found to be advantageous for use in connection with optical lithography processes for creating semiconductor elements having narrow line widths. While the present invention is not necessarily so limited, an appreciation of various aspects of the invention may be obtained through a discussion of various application examples in such an environment.

An important part of semiconductor processing is the capability of the optical lithographic process to assist in forming elements of extremely small geometry. When using optical lithography to create semiconductor elements such as narrow linewidths, due to diffraction issues, relative line shortening effects are inherent. The present invention address these effects by methods and systems arranged to characterize the extent of the effects for a given application, and then calibrate the optical measurements used for imaging structures, including those having relatively narrow linewidths, onto the wafer. The following discussion reveals that the characterization of the relative line shortening effects can be obtained through computer simulation or through a more rigorous mask and measure procedure.

Optical line shortening measurements such as those discussed herein are based on the reflectance of a patterned resist film. Reflection from a grating is affected by diffraction and scattering as the pitch is decreased. Additionally, reflectance of the focus box structure (e.g., FIG. 1A), is further complicated by profile and end-of-line effects. The optical line shortening measurement of the focus box structure severely over-predicts the actual truncation as measured by a SEM (e.g., FIG. 1A). For example, where the minimum optical line shortening for a typical set of data is 0.16 $\mu$m, the measurement by a SEM might yield a truncation of 0.04 $\mu$m. In connection with the present invention, it has been discovered that this discrepancy is attributable to diffraction effects of the measuring optical beam whose wavelength (500±100 nm) is much larger than the line widths in the grating used in the focus box structure. Diffraction is expected to be a function of both line width in the grating (i.e., the length of the lines defining the gating) and the pitch of the grating.

Figure 1C:
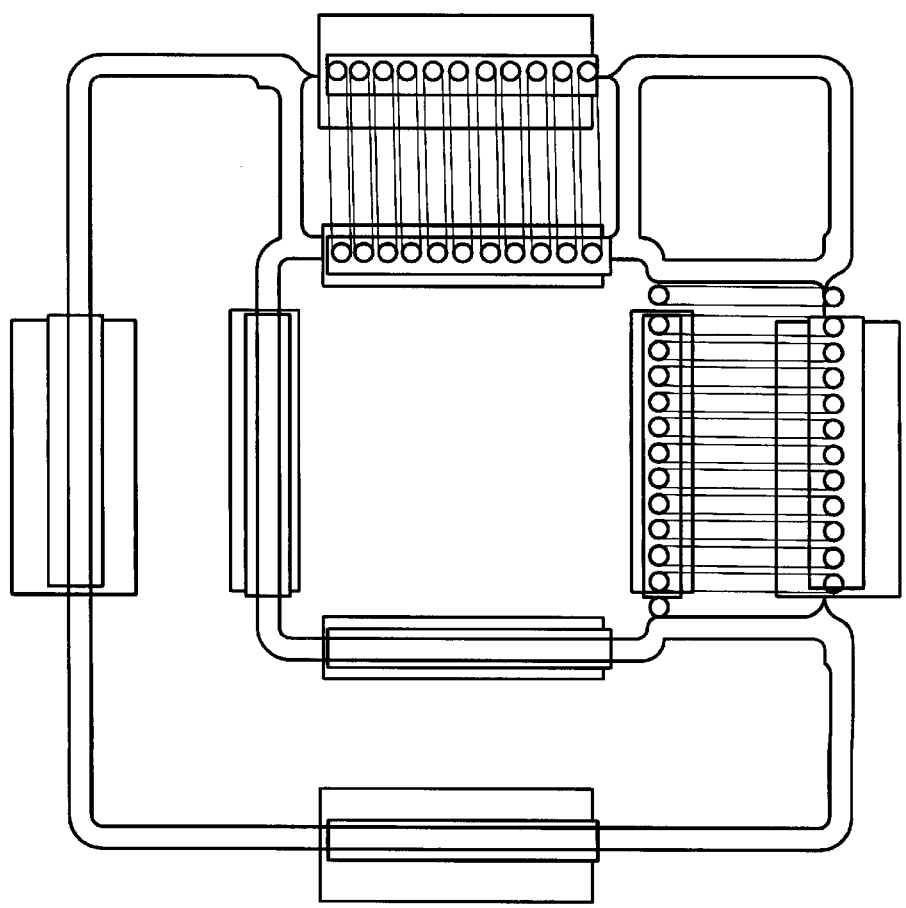

The reflectance of the focus box pattern and subsequent image capture of the line edges (FIG. 1C) is simulated, in a simplified manner, by observing the diffraction behavior of sub 0.5 $\mu$m lines to optical illumination. For example, simulating the transmission of 500±100 nm broadband coherent light through a binary mask having a sub 0.5 $\mu$m grating of finite length is straight forward. Neglecting scattering and interference effects caused by the resist and substrate, the aerial image at the end of the lines would qualitatively mimic the response of reflected optical light to trends in line size, line length and pitch of the grating. To determine whether this relationship is linear with line shortening, the aerial images of 0.25 $\mu$m lines and spaces are simulated with line lengths on the mask from 2.7 $\mu$m to 3.3 $\mu$m. Line edge determination by the metrology tool is arbitrary chosen to be the distance at which the aerial image was 75% of its initial value. Consequently, simulated line shortening is the difference in line lengths of a grating and reference solid 3.0 $\mu$m block respectively and, as discussed further below, the simulated line length bias is linear with the length bias used on the mask. In this manner, general responses of the alignment tool to changes in the focus box pattern (such as physical line shortening, pitch and line size of the grating) are readily predicted and the results are used to calibrate the optical alignment tool. The optical alignment tool is then used to fabricate the features of the semiconductor devices.

As another simulation example for predicting the responses of the optical alignment tool to pitch and line shortening, a grating is drawn as a binary mask with a given pitch, line size and line length. An aerial image is simulated at 500±100 nm. The line length response of the measuring tool is simulated at constant threshold level of the aerial image.

An important aspect of the present invention relates to two corrections that are determined to accurately relate optical measurements to the actual line shortening. The first is an offset in linearity and, as will be discussed in more detail below, this is a function of the threshold of the optical measuring tool. The second correction is due to a pitch effect. Gratings of various pitches with lines of the same length show that the optical response increases with the pitch even though the line length remains constant.

According to example embodiments of the present invention, optical line shortening measurement equipment is calibrated by measuring the linearity offset at constant grating pitch and duty cycle versus line length, and then measuring the pitch effect. However, the order of such measuring is not critical. Alternatively, these affects are modeled using aerial image analogy or a more accurate reflection simulation.

Figure 2:
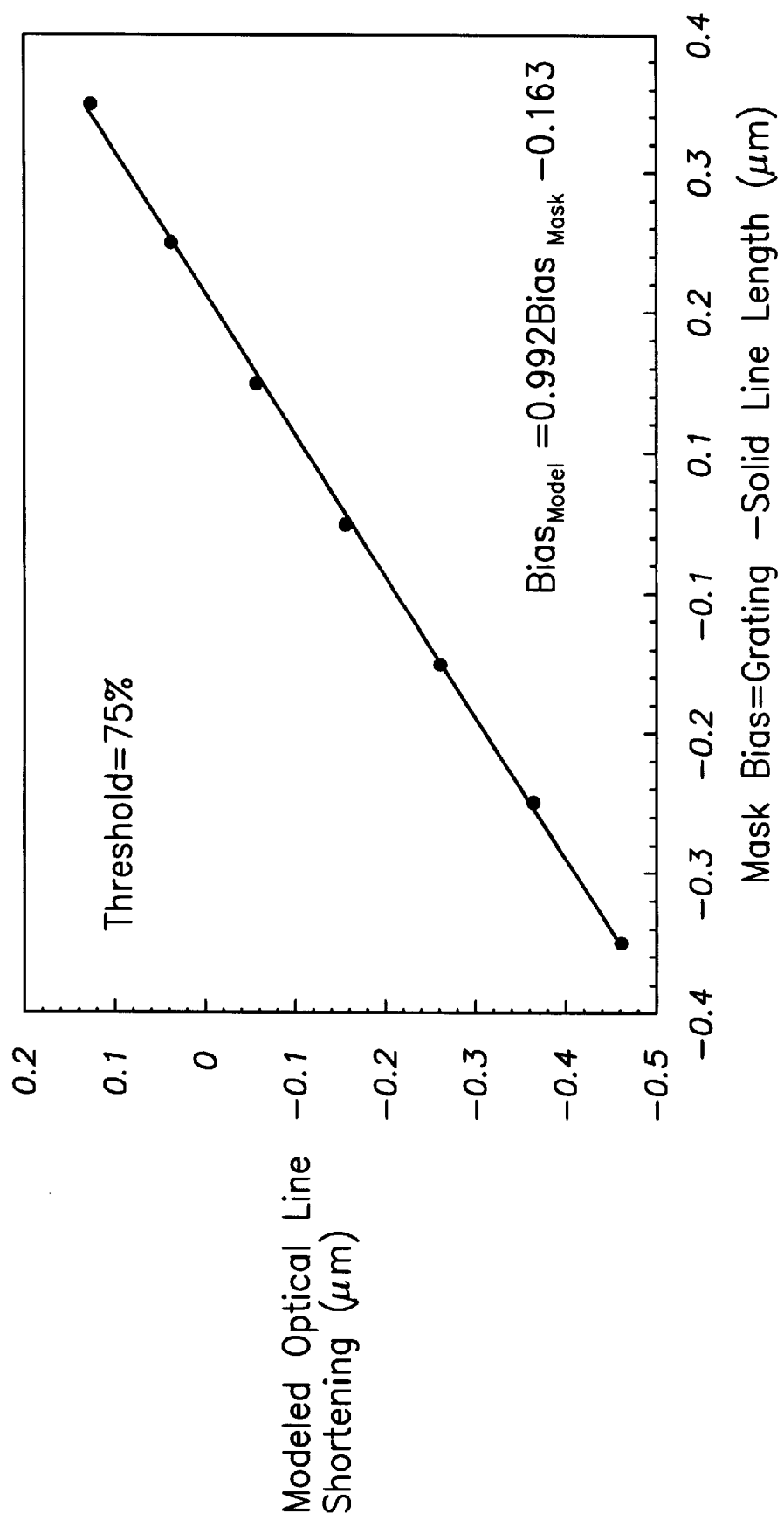
FIG. 2 is a graph showing a relationship between a modeled optical line shortening effect and a mask bias for a specific example application, according to the present invention.

Turning now to the figures, FIG. 2 is a graph showing a relationship between a modeled optical line shortening effect and a mask bias for another specific simulation example application, according to the present invention. In this example, line shortening is simulated at a 75% threshold for 0.25 $\mu$m line and space gratings, with lengths ranging from 2.7 $\mu$m to 3.3 $\mu$m. For some optical alignment tools, this threshold can be related to the job setup (e.g., a function of the background light for the wafer and the focus value). The reference block is 3.00 $\mu$m and the line length mask bias is the difference between the grating and reference block line lengths.

Reference to the "threshold" for the particular application, such as 75% in the above example application, can be an important factor. The measurements generated by a given optical alignment tool often vary, and are dependent upon a number of factors particular to the application. These factors include, for example, variances in focus values, the qualities and type of substrate, and the responsiveness of the optical alignment tool and its setup parameters for the application. From one application to the next, an offset in linearity typically occurs as a result of these variances. Thus, the linear relationship illustrated in FIG. 2 yields the illustrated data at a 75% threshold, whereas another application impacted by such variances would likely shift the position of the linearity, but without significantly changing its slope.

Figure 3A:
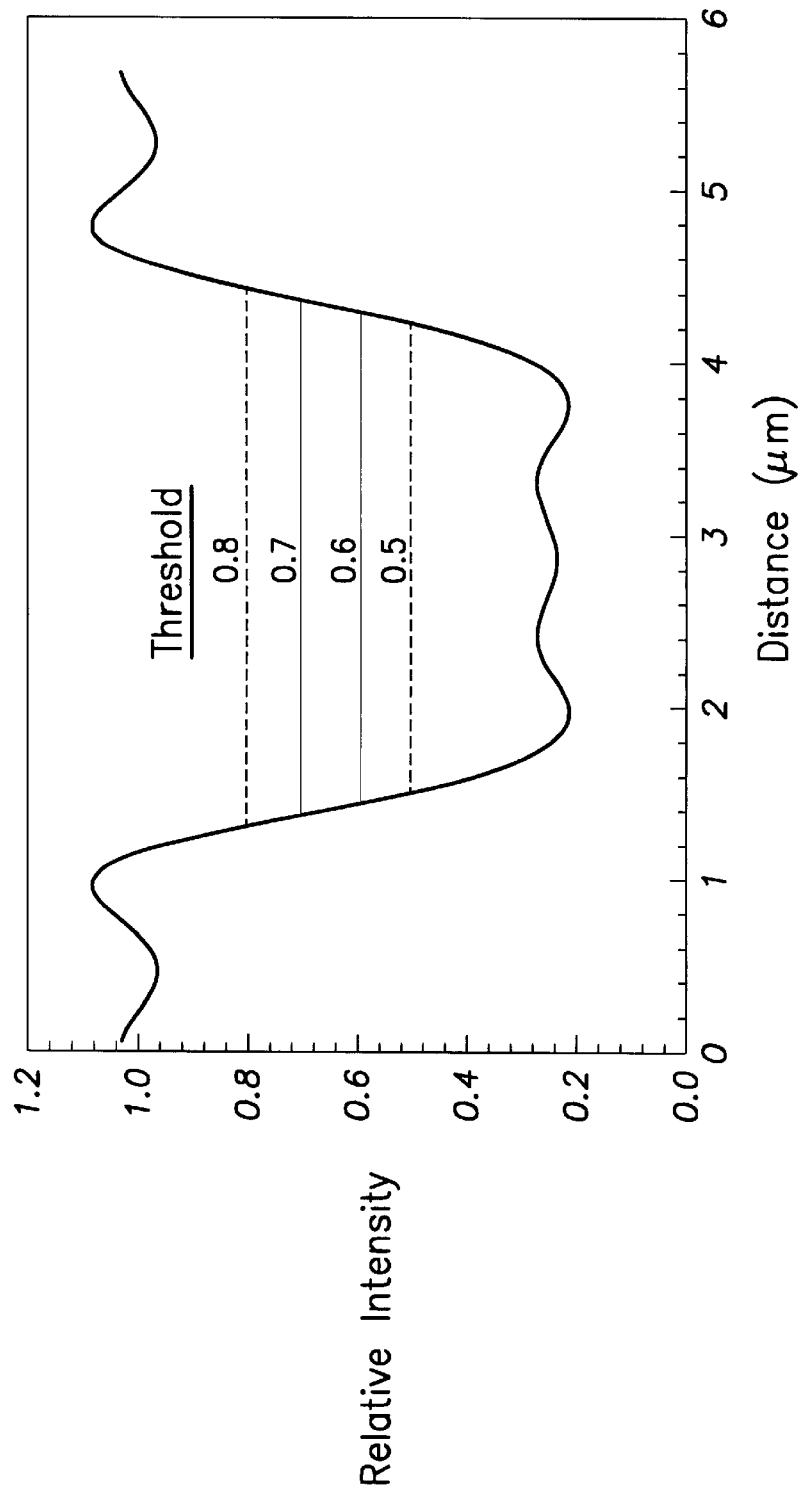
FIGS. 3A and 3B are graphs that illustrate an offset effect on a relationship such as the one of FIG. 2, according to the present invention.
Figure 3B:
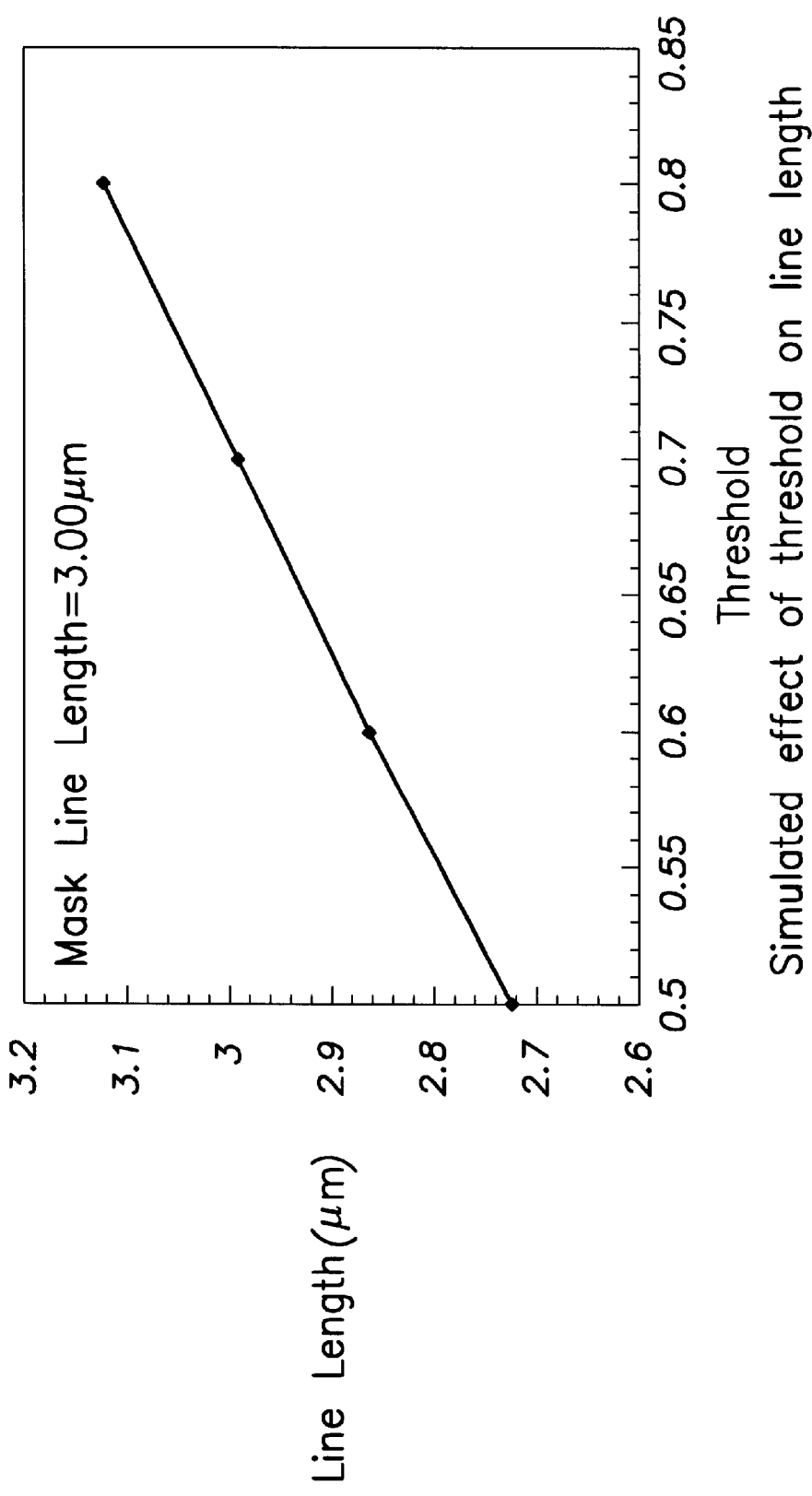

FIGS. 3A and 3B show that the offset effect discussed above in connection with FIG. 2 is primarily a threshold effect. FIG. 3A shows a simulation of a 0.25 $\mu$m line and a space grating aerial image with a 3.0 $\mu$m length. FIGS. 3A and 3B illustrate data taken with the optical alignment equipment setup at four thresholds: 0.5, 0.6, 0.7 and 0.8. FIG. 3B indicates that the measured line length is dependent on the threshold used.

For the same duty cycle and pitch, optical line shortening is significantly larger than line shortening as produced using SEM measurements (i.e., physical line shortening). Furthermore, the duty cycle dependence of optical line shortening measurements is significantly steeper than the SEM measurements. This is particularly true at certain pitches, such as a 0.35 $\mu$m pitch in an example application in which the optical line shortening drastically decreases as duty cycle increases above 0.5.

To compare the relative effect of pitch on optical and physical line shortening, data can be regressed as a function of line width. For all pitches, with certain exceptions, quadratic equations are fit to duty cycle and converted to line width. Simple linear interpolation can be used where a polynomial does not yield a suitable fit, such as above where the data is at 0.35 μm pitch. Optical and physical line shortening are then determined at various line sizes, for example, 0.20 μm, 0.25 μm, 0.30 μm and 0.35 μm line sizes at the four pitches studied within the bounds of the raw data.

Figure 4A:
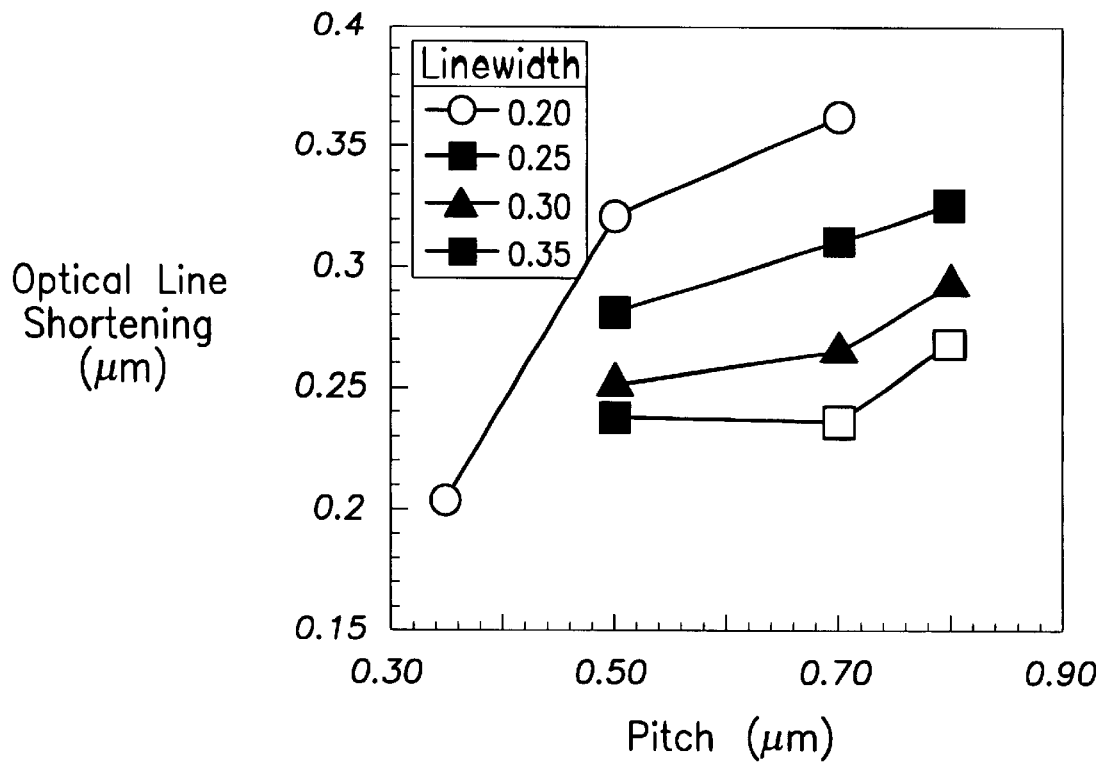
FIGS. 4A and 4B are graphs respectively showing optical (top) and physical (bottom) line shortening effects, specifically illustrating a relationship between line shortening versus pitch for various line widths, according to the present invention.
Figure 4B:
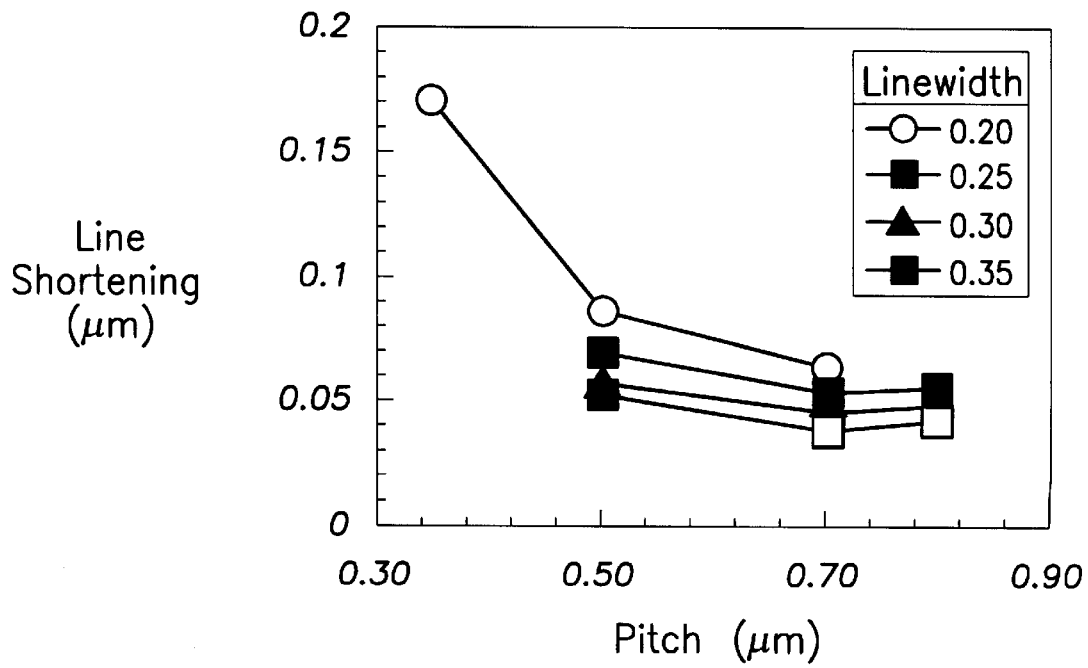

FIGS. 4A and 4B shows optical and physical line shortening versus pitch at these above-mentioned example line widths. Physical line shortening decreases or remains relatively stable as pitch increases (FIG. 4B). However, optical line shortening has the opposite effect by increasing with pitch at constant line width.

In connection with the present invention, it has been discovered that line shortening determined optically with the focus box increases with pitch at constant line size, whereas the actual line shortening decreases or remains relatively constant. In one example application, aerial images of 0.2 μm lines at pitches of 0.35 μm, 0.5 μm and 0.7 μm were simulated. The grating length was kept constant at 3.00 μm. FIG. 5 shows these aerial images along with an aerial image for a solid block of 3.00 μm length. In this context, it is assumed that the metrology tool will choose edges at 75% of the initial intensity, and that line shortening as determined by the optical tool is the difference in line length of the solid and grating aerial images at this 75% threshold. Because the slope of the aerial images decreases at the line edge as pitch increases, optically measured line shortening increases with pitch even though the actual feature has the same (3.00 μm) line length. This "pitch error" in the optical measurements is shown in FIG. 6, which illustrates the difference in behavior between optical and physical line shortening measurements in FIG. 4.

In connection with the present invention, it has also been discovered that line shortening determined optically changes depending on the duty cycle of the lines in the grating. In other words, the spacing between the lines, versus the width of the lines, also effects the accuracy of the optical measurements and should also be taken into account, in a conventional linear regression analysis, along with the relationships pertaining to pitch and grating length. One approach for determining the duty cycle effect is to obtain optical measurements using a mask with lines having constant pitch and grating length, but with varying duty cycles. Data is then gathered, for example, using a SEM for measuring the physical implementation, and this data is compared with the corresponding optical measurements. Using a linear regression analysis, the relationship between the optical measurements and the physical measurements are also factored in and the optical alignment equipment calibrated accordingly.

Figure 7A:
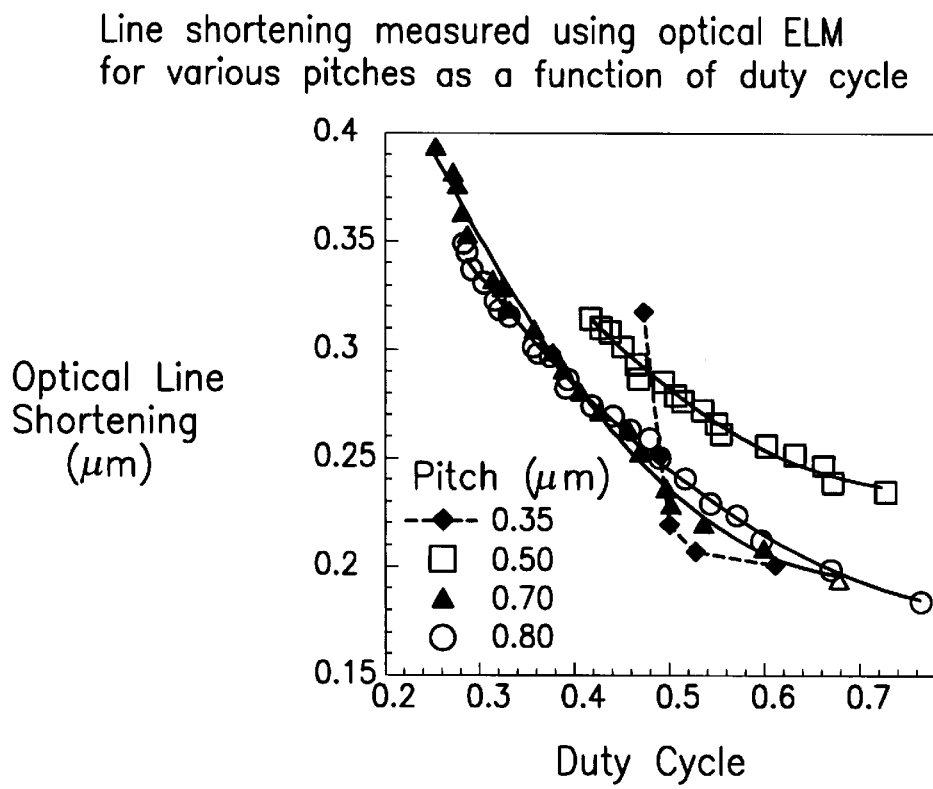
FIGS. 7A and 7B are graphs showing a relationship between physical line shortening data as a function of duty cycle (line-size/pitch), according to the present invention.
Figure 7B:
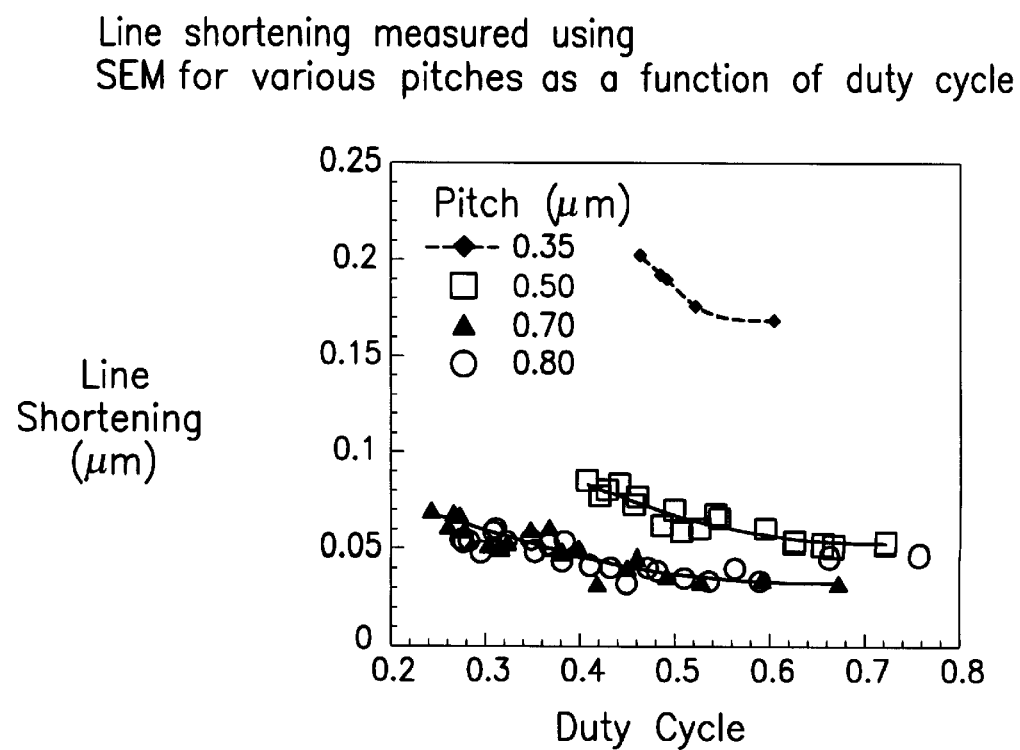

For an example application, FIG. 7A illustrates optical versus physical line shortening data as a function of duty cycle (line-size/pitch). FIG. 7B is the corresponding graph of line shortening determined by SEM measurements versus duty cycle. FIGS. 7A and 7B show that optical and physical line shortening decreases as duty cycle increases. For convenience, exposure can be used to adjust duty cycle rather than separate masks with various duty cycles. Consequently, for the exemplary application shown, line shortening and duty cycle are closely correlated as shown in FIG. 7B.

For the same duty cycle and pitch, optical line shortening is significantly larger than line shortening found via SEM measurements (i.e., physical line shortening). Furthermore, the duty cycle dependence of optical line shortening measurements is significantly steeper than the SEM measurements. This is particularly true at 0.35 μm pitch in which the optical line shortening drastically decreases as duty cycle increased above 0.5.

In some applications, there is an additional error inherent in optical line shortening measurements. The graph of FIG. 2 illustrates the change in line shortening as determined from threshold measurements against the change in grating length. While the slope is near unity, there is a nonzero intercept. This indicates a systematic correction in optical line shortening measurements due to the threshold at the line edge used to determine its length. It has been discovered in connection with the present invention that this intercept can vary with the effective threshold and physically is a function of, for example, the job setup and/or the substrate.

Optical measurements for these errors are correctable if the response of the optical metrology tool to edge threshold is sufficiently well known. Despite the above errors in optical measurements of line shortening, there is a correlation between physical and optical line shortening measurements (as in FIG. 9 of Appendix). For a focus box of set pitch, line shortening measurements determined optically are reasonably linear with the physical implementation. For applications that are unaffected by the above errors, relative line shortening between two resists at the same line size and pitch are determined, and the line shortening of a particular feature is monitored.

According to one example process of the present invention, optical line shortening measurement equipment is calibrated by comparing a series of focus boxes whose grating line width and spacing is fixed but whose length varies by known biases. Optical line shortening measurements are compared to the grating lengths to obtain the calibration curve shown in FIG. 2. Next, a series of focus boxes whose gratings have the same line width and line length but at various pitches. This yields a calibration curve such as shown in FIG. 6. The physical implementation is then compared to the optical.

To avoid requiring SEM measurements of the physical line shortening for the above comparisons, lines that are sufficiently large (e.g., 0.40 μm lines and spaces) can be used to minimize line shortening. Although the actual line shortening may be small, the optical offset and pitch effect remain. If smaller features are desired, then a SEM measurement feature for line shortening can be optionally included in a SEM line shortening measurement feature strategically placed, for example, using a corner of the solid portion of the focus box of FIG. 1A.

For additional information regarding the above example applications, including responses of a conventional optical alignment tool (e.g., KLA model 5105), reference may be made to a paper entitled, "Understanding Optical End Of Line Metrology," by the inventors of the instant application. This paper is attached as an appendix to the application and is herein incorporated by reference.

Accordingly, the present invention provides an arrangement and method for calibrating optical alignment equipment to overcome the inherent over-estimates of actual line shortening obtained with optical metrology instruments. This calibration is made as a function of pitch effect and a relationship that is determined empirically or via simulations. It is also useful to make this calibration as a function of the relationship between physical line shortening and duty cycle (line-size/pitch). By taking the effect of these three effects in a linear regression analysis, calibration of the optical alignment equipment will be much more accurate.

The various embodiments described above are provided by way of illustration only and are not intended to limit the invention. Those skilled in the art will readily recognize various modifications and changes that may be made to the present invention without strictly following the example embodiments and applications illustrated and described herein. The scope of the present invention is set forth in the following claims.

What is claimed is:

1. A method for manufacturing a semiconductor device including elements with narrow linewidths, comprising:
    providing an optically-based representation of the narrow linewidth elements;
    optically predicting line shortening of the narrow linewidth elements;
    determining a relationship between the narrow linewidth elements of varying line lengths using the representation and the narrow linewidth elements in a physical implementation of the representation;
    determining a pitch effect for the narrow linewidth elements when using the alignment tool; and
    calibrating the alignment tool as a function of the relationship and pitch effect.

2. A method for manufacturing a semiconductor device, according to claim 1, further including determining a duty cycle effect and wherein calibrating the alignment tool includes calibrating as a function of the relationship and pitch effect and duty cycle, and using the calibrated alignment tool in an optical photolithography process to form the narrow linewidth elements as part of the semiconductor device.

3. A method for manufacturing a semiconductor device, according to claim 1, wherein determining a relationship involves using a computer to simulate the relationship.

4. A method for manufacturing a semiconductor device, according to claim 1, wherein determining a relationship involves using an optical tool for measurements.

5. A method for manufacturing a semiconductor device, according to claim 1, wherein determining a relationship includes determining an offset in linearity.

6. A method for manufacturing a semiconductor device, according to claim 5, wherein determining an offset includes determining at least one of the following: a relationship between optical line shortening and line length mask bias; a degree of linearity in a relationship between optical line shortening and line length mask bias; and a relationship between line size and at least one of an optical line shortening factor and line length mask bias factor.

7. A method for manufacturing a semiconductor device, according to claim 1, wherein determining a pitch effect includes obtaining measurements of a plurality of pitches for lines having the same length.

8. A method for manufacturing a semiconductor device, according to claim 7, wherein determining a relationship includes obtaining measurements of a plurality of line lengths for a set of lines having the same pitch.

9. A method for manufacturing a semiconductor device, according to claim 1, wherein determining a pitch effect includes obtaining measurements of a plurality of pitches for lines having the same length, and wherein determining a relationship includes obtaining measurements of a plurality of line lengths for a set of lines having the same pitch.

10. A method for manufacturing a semiconductor device, according to claim 1, wherein determining a relationship includes determining an absolute offset in linearity, and further including using the calibrated alignment tool in an optical photolithography process to form the narrow linewidth elements as part of the semiconductor device.

11. A method for manufacturing a semiconductor device, according to claim 8, wherein determining an absolute relationship includes determining a relationship between optical line shortening and line length mask bias; and determining a degree of linearity in a relationship between optical line shortening and line length mask bias.

12. A system for manufacturing a semiconductor device including elements with narrow linewidths, comprising:
    means for providing an optically-based representation of the narrow linewidth elements;
    means for predicting line shortening of the narrow linewidth elements;
    means for determining a relationship between the narrow linewidth elements of varying line lengths using the representation and the narrow linewidth elements in a physical implementation of the representation;
    means for determining a pitch effect for the narrow linewidth elements when using the predicting means; and
    means for calibrating the alignment tool as a function of the relationship and pitch effect.

13. A system for manufacturing a semiconductor device including elements with narrow linewidths, comprising:
    means for providing an optically-based representation of the narrow linewidth elements;
    an optical alignment measurement tool for predicting line shortening of the narrow linewidth elements;
    a scanning electron microscope configured and arranged to determine a relationship between the narrow linewidth elements of varying line lengths using the representation and the narrow linewidth elements in a physical implementation of the representation, and configured and arranged to determine a pitch effect for the narrow linewidth elements when using the alignment tool; and
    a processor configured and arranged to calibrate the optical alignment measurement tool as a function of the relationship and pitch effect.

14. A system for manufacturing a semiconductor device including elements with narrow linewidths, according to claim 13, further including using the calibrated alignment tool in an optical photolithography process to form the narrow linewidth elements as part of the semiconductor device.

15. A system for manufacturing a semiconductor device including elements with narrow linewidths, according to claim 13, wherein determining a relationship involves using a computer to simulate the relationship.

16. A system for manufacturing a semiconductor device including elements with narrow linewidths, according to claim 13, wherein determining a relationship involves using an optical tool for measurements.

17. A system for manufacturing a semiconductor device including elements with narrow linewidths, according to claim 13, wherein determining a relationship includes determining an offset in linearity.

18. A system for manufacturing a semiconductor device including elements with narrow linewidths, according to claim 17, wherein determining an offset includes determining at least one of the following: a relationship between optical line shortening and line length mask bias; a degree of linearity in a relationship between optical line shortening and line length mask bias; and a relationship between line size in the grating and at least one of an optical line shortening factor and line length mask bias factor.

19. A system for manufacturing a semiconductor device including elements with narrow linewidths, according to claim 13, wherein determining a pitch effect includes obtaining measurements of a plurality of pitches for lines having the same length.

20. A system for manufacturing a semiconductor device including elements with narrow linewidths, according to claim 13, wherein determining a relationship includes obtaining measurements of a plurality of line lengths for a set of lines having the same pitch.

21. A system for manufacturing a semiconductor device including elements with narrow linewidths, according to claim 13, wherein determining a pitch effect includes obtaining measurements of a plurality of pitches for lines having the same length, and wherein determining a relationship includes obtaining measurements of a plurality of line lengths for a set of lines having the same pitch.

22. A system for manufacturing a semiconductor device including elements with narrow linewidths, according to claim 21, wherein determining a relationship includes determining an absolute offset in linearity, and further including using the calibrated alignment tool in an optical photolithography process to form the narrow linewidth elements as part of the semiconductor device.

23. A system for manufacturing a semiconductor device including elements with narrow linewidths, according to claim 13, wherein determining an absolute relationship includes determining a relationship between optical line shortening and line length mask bias; and determining a degree of linearity in a relationship between optical line shortening and line length mask bias.

* * * * *